US012684964B2

(12) United States Patent
Wan

(10) Patent No.: US 12,684,964 B2
(45) Date of Patent: Jul. 14, 2026

(54) OLED DISPLAY PANEL AND OLED DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zhijun Wan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 488 days.

(21) Appl. No.: 17/756,641

(22) PCT Filed: Apr. 20, 2022

(86) PCT No.: PCT/CN2022/087789
§ 371 (c)(1),
(2) Date: May 29, 2022

(87) PCT Pub. No.: WO2023/197345
PCT Pub. Date: Oct. 19, 2023

(65) Prior Publication Data
US 2024/0164154 A1 May 16, 2024

(30) Foreign Application Priority Data
Apr. 11, 2022 (CN) ........................ 202210376331.X

(51) Int. Cl.
*H10K 59/131* (2023.01)
*H10K 50/16* (2023.01)
*H10K 50/17* (2023.01)

(52) U.S. Cl.
CPC ........... *H10K 59/131* (2023.02); *H10K 50/16* (2023.02); *H10K 50/171* (2023.02)

(58) Field of Classification Search
CPC ........... H10K 59/131; H10K 59/80516; H10K 59/80522; H10K 59/82; H10K 59/873;
(Continued)

(56) References Cited

U.S. PATENT DOCUMENTS 10,206,290 B2 * 2/2019 Oh ...................... H10K 50/8426
2011/0260166 A1 * 10/2011 Kim .................... H10K 59/179
257/59
(Continued)

FOREIGN PATENT DOCUMENTS

CN 101682957 A 3/2010
CN 107632743 A 1/2018
(Continued)

OTHER PUBLICATIONS

Adachi et al., High efficiency transparent organic light emitting device, 2001, machine translation of WO0167825 A1, pp. 1-12. (Year: 2001).*
(Continued)

*Primary Examiner* — Natalia A Gondarenko
(74) *Attorney, Agent, or Firm* — PV IP PC; Peter Stecher; Wei Te Chung

(57) ABSTRACT

The present application provides an organic light emitting diode (OLED) display panel and an OLED display device. The OLED display panel disposes an electron injection layer and the electron transport layer in a bridge region such that one metal mask plate can be used to form an electron injection layer, an electron transport layer, and a common electrode layer, which improves a manufacturing efficiency of the OLED display panel and lowers a cost. Also, a high-level voltage end and a low-level voltage end are
(Continued)

connected to a first metal terminal and a second metal terminal respectively to achieve conductive connection between a common electrode layer and a metal terminal.

12 Claims, 4 Drawing Sheets

(58) Field of Classification Search
CPC ...... H10K 50/16; H10K 50/80; H10K 50/805; H10K 50/813; H10K 50/814; H10K 50/82; H10K 50/822; H10K 50/824; H10K 50/8426; H10K 50/88; H10K 71/00; H10K 71/861; H10K 71/70; H10K 2102/361; H10K 59/173; H10K 59/179; H10K 59/8722; H10K 59/8723; H10K 59/8792; H10K 59/88; H01L 33/62; H01L 25/0753; G09G 3/006; G09G 3/3233; G09G 2300/0426; G09G 2300/0452; G09G 2300/0819; G09G 2300/0842; G09G 2300/0861; G09G 2330/12; H05B 33/02; H05B 33/06; H05B 33/12; H05B 33/22; H05B 33/26
USPC ......................................... 257/79, 40, 59, 88
See application file for complete search history.

(56)                 References Cited

U.S. PATENT DOCUMENTS

| | | | | |
|---|---|---|---|---|
| 2012/0169226 A1* | 7/2012 | Huang | ................. | H10K 50/805 |
| | | | | 315/32 |
| 2014/0048778 A1 | 2/2014 | Park | | |
| 2014/0315339 A1* | 10/2014 | Kim | .................... | H10K 71/621 |
| | | | | 438/34 |
| 2017/0125725 A1* | 5/2017 | Paek | .................. | H10K 59/1315 |
| 2019/0157377 A1* | 5/2019 | Zeng | .................... | H10K 59/131 |
| 2020/0273940 A1* | 8/2020 | Byun | .................. | H10K 59/873 |
| 2021/0351371 A1* | 11/2021 | Wang | .................. | H10K 50/865 |

FOREIGN PATENT DOCUMENTS

| | | | | | | |
|---|---|---|---|---|---|---|
| CN | 107845655 | A | | 3/2018 | | |
| CN | 108987445 | A | | 12/2018 | | |
| CN | 110047886 | A | | 7/2019 | | |
| CN | 110212091 | A | | 9/2019 | | |
| CN | 111224004 | A | | 6/2020 | | |
| CN | 111584564 | A | * | 8/2020 | ......... | H01L 27/3246 |
| CN | 112133737 | A | | 12/2020 | | |
| CN | 112382646 | A | | 2/2021 | | |
| CN | 113053923 | A | | 6/2021 | | |
| JP | 2004213910 | A | * | 7/2004 | ......... | H01L 51/5246 |
| JP | 2011210613 | A | | 10/2011 | | |
| JP | 2013175414 | A | | 9/2013 | | |
| KR | 2012097665 | A | * | 9/2012 | ........ | G02F 1/133611 |
| WO | WO-0167825 | A1 | * | 9/2001 | ............. | A61F 7/123 |

OTHER PUBLICATIONS

Lee et al., Organic light emitting diode device, 2012, machine translation of KR 20120097665 A, pp. 1-7. (Year: 2012).*
Nishi et al., Light emitting device and its manufacturing method, 2004, machine translation of JP 2004213910 A, pp. 1-26. (Year: 2004).*
International Search Report in International application No. PCT/CN2022/087789,mailed on Dec. 19, 2022.
Written Opinion of the International Search Authority in International application No. PCT/CN2022/087789,mailed on Dec. 19, 2022.
Chinese Office Action issued in corresponding Chinese Patent Application No. 202210376331.X dated Sep. 21, 2024, pp. 1-6.

* cited by examiner (a)

(b)

OLED DISPLAY PANEL AND OLED DISPLAY DEVICE

FIELD OF INVENTION

The present application relates to a field of display technologies, especially to an organic light emitting diode (OLED) display panel and an OLED display device.

BACKGROUND OF INVENTION

With development of display technologies, for lowering a cost, a hole injection layer, hole transport layer and light emitting layer in an organic light emitting diode (OLED) display device are formed by an inkjet printing process. Because of a limit of a material of an electron transport layer and an electron injection layer, the electron transport layer and the electron injection layer can only be formed by an evaporation process. Also, a cathode is formed by an evaporation process. Because the cathode, when formed, needs to be connected to a metal wiring of a transistor, it is required that a film forming area of the cathode is greater than film forming areas of the electron injection layer and the electron transport layer, it requires at least two mask plates and a design of a plurality of chambers to form the cathode and the electron injection layer/electron transport layer with different film forming areas, which leads to a lowered manufacturing efficiency of the OLED display device.

Therefore, the conventional OLED display device has a technical issue of a conventional OLED display device having different mask plates for a cathode and electron injection layer/an electron transport layer and resulting in a lowered manufacturing efficiency of the OLED display device.

SUMMARY OF INVENTION

Technical Issue

An embodiment of the present application provides an organic light emitting diode (OLED) display panel and an OLED display device to ease a technical issue of a conventional OLED display device having different mask plates for a cathode and electron injection layer/an electron transport layer and resulting in a lowered manufacturing efficiency of the OLED display device.

Technical Solution

To solve the above issue, a technical solution provided by the present application is as follows:

An embodiment of the present application provides an organic light emitting diode (OLED) display panel, the OLED display panel includes:

an underlay;

a driver circuit layer disposed on a side of the underlay, wherein the driver circuit layer includes a metal terminal, the metal terminal includes a first metal terminal and a second metal terminal, and the first metal terminal and the second metal terminal are disposed insulatively;

a light emitting function layer disposed on a side of the driver circuit layer away from the underlay, wherein the light emitting function layer includes an electron injection layer, an electron transport layer, and a common electrode layer; and an encapsulation layer disposed on a side of the light emitting function layer away from the driver circuit layer;

wherein the OLED display panel includes a display region and a bridge region, in the bridge region, an electron injection layer and an electron transport layer are disposed between the common electrode layer and the metal terminal, a side of the first metal terminal is connected to a high-level voltage end, another side of the first metal terminal is connected to the electron transport layer, a side of the second metal terminal is connected to the electron transport layer, another side of the second metal terminal is connected to a low-level voltage end, and a voltage difference between the high-level voltage end and the low-level voltage end is greater than a turn-on voltage of the metal terminal and the common electrode layer.

In some embodiments, the first metal terminal and the second metal terminal are disposed in the bridge region on two sides of the display region.

In some embodiments, the first metal terminal includes a plurality of positive connection terminals, the second metal terminal includes a plurality of negative connection terminals, the positive connection terminals are disposed in the bridge region on two sides of the display region, the negative connection terminals are disposed in the bridge region on the two sides of the display region, and the positive connection terminals are disposed to correspond to the negative connection terminals.

In some embodiments, the positive connection terminals include a first positive connection terminal and a second positive connection terminal, the negative connection terminals include a first negative connection terminal and a second negative connection terminal, the first positive connection terminal and the first negative connection terminal are disposed in the bridge region on one of the sides of the display region, the second positive connection terminal and the second negative connection terminal are disposed in the bridge region on the other side of the display region, the first positive connection terminal is electrically connected to the first negative connection terminal, and the second positive connection terminal is electrically connected to the second negative connection terminal.

In some embodiments, the positive connection terminals include a third positive connection terminal and a fourth positive connection terminal, the negative connection terminals include a third negative connection terminal and a fourth negative connection terminal, the third positive connection terminal and the fourth positive connection terminal are disposed in a terminal region on one of the sides of the display region, the third negative connection terminal and the fourth negative connection terminal are disposed in a terminal region on the other side of the display region, the third positive connection terminal is electrically connected to the third negative connection terminal, and the fourth positive connection terminal is electrically connected to the fourth negative connection terminal.

In some embodiments, a material of the electron injection layer includes an organic material, a material of the electron transport layer includes an organic material, and the voltage difference between the high-level voltage end and the low-level voltage end is greater than a turn-on voltage of the electron injection layer and the electron transport layer.

In some embodiments, a temperature of the bridge region ranges from 50° C. to 120° C. when a voltage is inputted in the high-level voltage end and the low-level voltage end.

In some embodiments, a material of the common electrode layer includes a metal material, the voltage difference between the high-level voltage end and the low-level voltage end is greater than a first migration voltage of the metal material.

In some embodiments, a material of the electron injection layer includes a first conductive material, a material of the electron transport layer includes an organic material, the voltage difference between the high-level voltage end and the low-level voltage end is greater than a second migration voltage of the electron injection layer.

In some embodiments, a second conductive material is doped in the electron transport layer, and the voltage difference between the high-level voltage end and the low-level voltage end is greater than a third migration voltage of the second conductive material.

In some embodiments, a material of the electron injection layer includes an organic material, a material of the electron transport layer includes an organic material, a third conductive material is doped in at least one of the electron injection layer and the electron transport layer, and the voltage difference between the high-level voltage end and the low-level voltage end is greater than a fourth migration voltage of the third conductive material.

Also, the embodiment of the present application provides an OLED display device, the OLED display device includes an OLED display panel and a power source, and the OLED display panel includes:

an underlay;

a driver circuit layer disposed on a side of the underlay, wherein the driver circuit layer includes a metal terminal, the metal terminal includes a first metal terminal and a second metal terminal, and the first metal terminal and the second metal terminal are disposed insulatively;

a light emitting function layer disposed on a side of the driver circuit layer away from the underlay, wherein the light emitting function layer includes an electron injection layer, an electron transport layer, and a common electrode layer; and an encapsulation layer disposed on a side of the light emitting function layer away from the driver circuit layer;

wherein the OLED display panel includes a display region and a bridge region, in the bridge region, an electron injection layer and an electron transport layer are disposed between the common electrode layer and the metal terminal, a side of the first metal terminal is connected to a high-level voltage end, another side of the first metal terminal is connected to the electron transport layer, a side of the second metal terminal is connected to the electron transport layer, another side of the second metal terminal is connected to a low-level voltage end, and a voltage difference between the high-level voltage end and the low-level voltage end is greater than a turn-on voltage of the metal terminal and the common electrode layer.

In some embodiments, the high-level voltage end is connected to a positive electrode of the power source, and the low-level voltage end is connected to a negative electrode of the power source.

In some embodiments, the first metal terminal and the second metal terminal are disposed in the bridge region on two sides of the display region.

In some embodiments, the first metal terminal includes a plurality of positive connection terminals, the second metal terminal includes a plurality of negative connection terminals, the positive connection terminals are disposed in the bridge region on two sides of the display region, the negative connection terminals are disposed in the bridge region on the two sides of the display region, and the positive connection terminals are disposed to correspond to the negative connection terminals.

In some embodiments, the positive connection terminals include a first positive connection terminal and a second positive connection terminal, the negative connection terminals include a first negative connection terminal and a second negative connection terminal, the first positive connection terminal and the first negative connection terminal are disposed in the bridge region on one of the sides of the display region, the second positive connection terminal and the second negative connection terminal are disposed in the bridge region on the other side of the display region, the first positive connection terminal is electrically connected to the first negative connection terminal, and the second positive connection terminal is electrically connected to the second negative connection terminal.

In some embodiments, the positive connection terminals include a third positive connection terminal and a fourth positive connection terminal, the negative connection terminals include a third negative connection terminal and a fourth negative connection terminal, the third positive connection terminal and the fourth positive connection terminal are disposed in a terminal region on one of the sides of the display region, the third negative connection terminal and the fourth negative connection terminal are disposed in a terminal region on the other side of the display region, the third positive connection terminal is electrically connected to the third negative connection terminal, and the fourth positive connection terminal is electrically connected to the fourth negative connection terminal.

In some embodiments, a material of the electron injection layer includes an organic material, a material of the electron transport layer includes an organic material, and the voltage difference between the high-level voltage end and the low-level voltage end is greater than a turn-on voltage of the electron injection layer and the electron transport layer.

In some embodiments, a temperature of the bridge region ranges from 50° C. to 120° C. when a voltage is inputted in the high-level voltage end and the low-level voltage end.

In some embodiments, a material of the common electrode layer includes a metal material, the voltage difference between the high-level voltage end and the low-level voltage end is greater than a first migration voltage of the metal material.

Advantages

The present application provides an OLED display panel and an OLED display device. The OLED display panel includes an underlay, a driver circuit layer, a light emitting function layer, and an encapsulation layer. The driver circuit layer is disposed on a side of the underlay. The driver circuit layer includes a metal terminal, and the metal terminal includes a first metal terminal and a second metal terminal. The first metal terminal and the second metal terminal are disposed insulatively. The light emitting function layer is disposed on a side of the driver circuit layer away from underlay. The light emitting function layer includes an electron injection layer. The electron transport layer, the common electrode layer, and the encapsulation layer are disposed on a side of the light emitting function layer away from driver circuit layer. The OLED display panel includes a display region and a bridge region. In bridge region, an electron injection layer and an electron transport layer are disposed between the common electrode layer and the metal terminal. A side of the first metal terminal is connected to a high-level voltage end, and another side of the first metal terminal is connected to the electron transport layer. A side of the second metal terminal is connected to the electron transport layer, and another side of the second metal terminal is connected to a low-level voltage end. A voltage difference between the high-level voltage end and the low-level voltage end is greater than a turn-on voltage of the metal terminal and the common electrode layer. The present application disposes the electron injection layer and the electron transport layer in the bridge region such that one metal mask plate can be used to form the electron injection layer, the electron transport layer, and the common electrode layer, which improves a manufacturing efficiency of the OLED display panel and lowers a cost. Also, the high-level voltage end and the low-level voltage end are connected to the first metal terminal and the second metal terminal respectively, and the voltage difference between the high-level voltage end and the low-level voltage end is greater than the turn-on voltage of the metal terminal and the common electrode layer such that a conductivity of the electron injection layer and the electron transport layer is poor, and under an effect of the voltage, by burning and connecting the electron injection layer and the electron transport layer or electron migration, conductive connection of the common electrode layer and the metal terminal can be achieved to make the OLED display panel work normally.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

The embodiment of the present application aims at an technical issue of a conventional OLED display device having different mask plates for a cathode and electron injection layer/an electron transport layer and resulting in a lowered manufacturing efficiency of the OLED display device and provides an OLED display panel and an OLED display device for solve the above technical issue.

Figure 1:
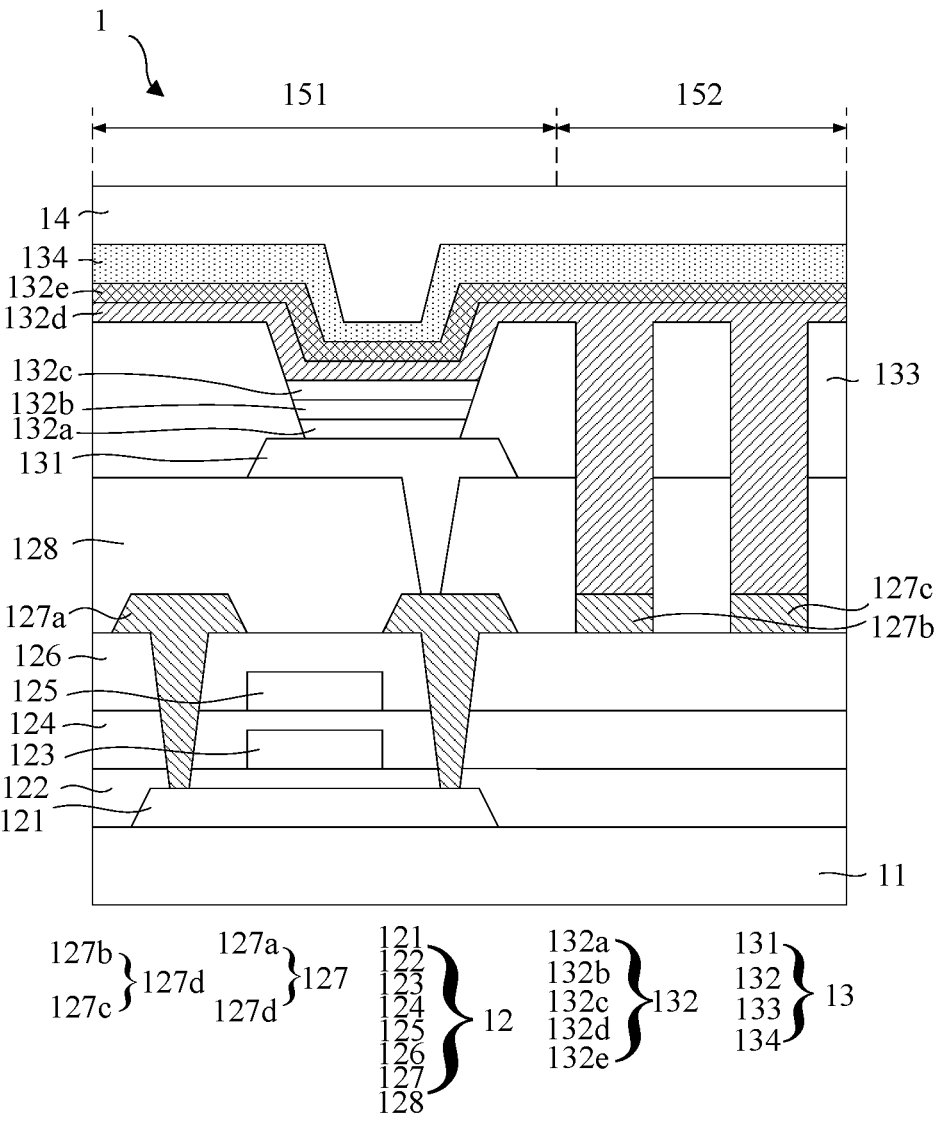
FIG. 1 is a first schematic view of an organic lighting emitting diode (OLED) display panel provided by an embodiment of the present application.
Figure 2:
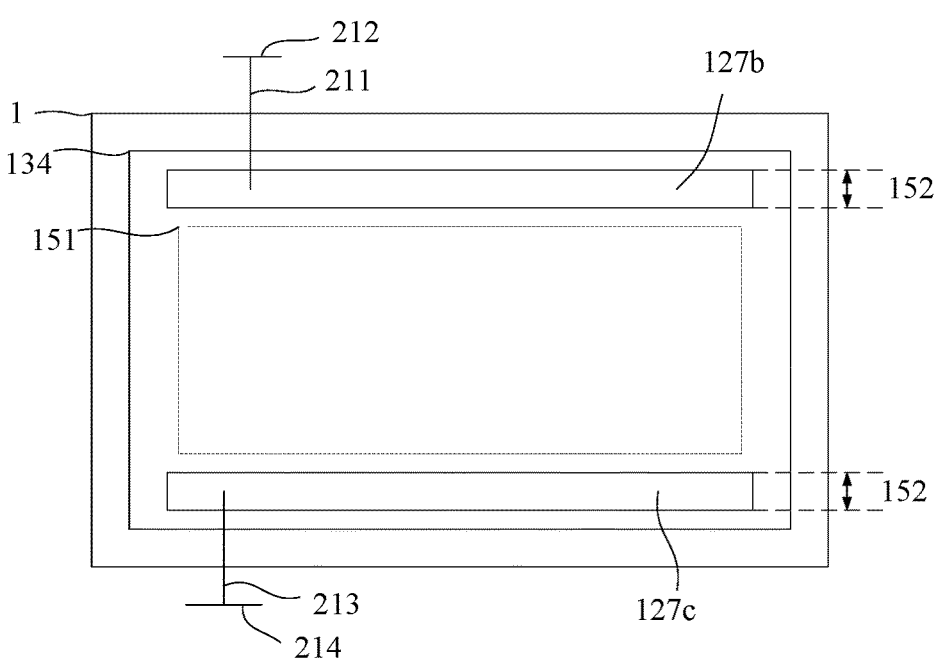
FIG. 2 is a second schematic view of the OLED display panel provided by the embodiment of the present application.

With reference to FIGS. 1 and 2, the embodiment of the present application provides an OLED display panel, and the OLED display panel 1 includes:

an underlay 11;

a driver circuit layer 12 disposed on a side of the underlay 11, the driver circuit layer 12 includes metal terminal 127d, the metal terminal 127d includes a first metal terminal 127b and a second metal terminal 127c, the first metal terminal 127b and the second metal terminal 127c are disposed insulatively;

a light emitting function layer 13 disposed on a side of the driver circuit layer 12 away from the underlay 11, wherein the light emitting function layer 13 includes an electron injection layer 132e, an electron transport layer 132d, and a common electrode; and an encapsulation layer 14 disposed on a side of the light emitting function layer 13 away from the driver circuit layer 12;

wherein the OLED display panel 1 includes a display region 151 and a bridge region 152, in the bridge region 152, an electron injection layer 132e and an electron transport layer 132d are disposed between the common electrode layer 134 and the metal terminal 127d, a side of the first metal terminal 127b is connected to the high-level voltage end 212, another side of the first metal terminal 127b is connected to the electron transport layer 132d, a side of the second metal terminal 127c is connected to the electron transport layer 132d, another side of the second metal terminal 127c is connected to the low-level voltage end 214, and a voltage difference between the high-level voltage end 212 and the low-level voltage end 214 is greater than a turn-on voltage of the metal terminal 127d and the common electrode layer 134.

The embodiment of the present application provides an OLED display panel. The OLED display panel disposes the electron injection layer and the electron transport layer in the bridge region such that one metal mask plate can be used to form the electron injection layer, the electron transport layer, and the common electrode layer, which improves a manufacturing efficiency of the OLED display panel and lowers a cost. Also, the high-level voltage end and the low-level voltage end are connected to the first metal terminal and the second metal terminal respectively, and the voltage difference between the high-level voltage end and the low-level voltage end is greater than the turn-on voltage of the metal terminal and the common electrode layer such that a conductivity of the electron injection layer and the electron transport layer is poor, and under an effect of the voltage, by burning and connecting the electron injection layer and the electron transport layer or electron migration, conductive connection of the common electrode layer and the metal terminal can be achieved to make the OLED display panel work normally.

It should be explained that the turn-on voltage of the metal terminal and the common electrode layer refers to a voltage capable of connecting the metal terminal and the common electrode layer when inputted. Particularly, the voltage can be greater to make a current strike through the electron injection layer and the electron transport layer to connect the metal terminal and the common electrode layer. At this time, the voltage can serve as a turn-on voltage. Also, a voltage can be inputted to make metal particles migrate under an effect of an electrical field to further connect the metal terminal and the common electrode layer. At this time, the voltage can serve as a turn-on voltage. Further, the turn-on voltage of the present application is not limited by the above examples, and will be described in detail in the following embodiments.

It should be explained that in FIG. 2, the high-level voltage end 212 is connected to the first metal terminal 127b through a first metal wiring 211, the low-level voltage end 214 is connected to the second metal terminal 127c through a second metal wiring 213. Because FIG. 2 is a perspective view, the shown high-level voltage end, low-level voltage end, first metal wiring, and second metal wiring are located outside the OLED display panel. However, during an actual design, the high-level voltage end, the low-level voltage end, the first metal wiring, and the second metal wiring would be disposed in the OLED display panel to protect each wiring and terminal for convenience of connection among terminals.

Particularly, for example, the first metal wiring, the second metal wiring, the high-level voltage end, the low-level voltage end can be formed by a source and drain electrode layer. However, the embodiment of the present application is not limited thereto. For example, to prevent the first metal wiring, the second metal wiring, the high-level voltage end, and the low-level voltage end from occupying a space of the source and drain electrode layer, the layers can be formed by a first metal layer, a second metal layer, and a light shielding layer.

It should be explained that in FIG. 2 the common electrode layer is marked with a reference number 134, the reference number 134 shows the boundary of the common electrode layer. However, actually, because of the common electrode layer in the present application, the electron injection layer and the electron transport layer are formed by the same mask plate. Although, a certain error exists to cause the common electrode layer unable to completely coincide with the electron injection layer and the electron transport layer, the boundary of the common electrode layer can be deemed as the boundary of the electron injection layer and the electron transport layer. Namely, the boundary of the common electrode layer referred to by the reference number 134 can also be the boundary of the electron injection layer and the electron transport layer. The electron injection layer and the electron transport layer are disposed between the metal terminal and the common electrode layer. Namely, the common electrode layer, the electron injection layer and the electron transport layer, can be formed by the same mask plate.

In an embodiment, with reference to FIGS. 2, the first metal terminal 127b and the second metal terminal 127c are disposed in the bridge region 152 on two sides of the display region 151. Disposing the first metal terminal and the second metal terminal connected respectively to the high-level voltage end and the low-level voltage end in the bridge region of the two sides makes a current sequentially move from the first metal wiring to the first metal terminal, then move from the first metal terminal to the parts of the electron transport layer and the electron injection layer on the first metal terminal, and then move from the part of the electron injection layer on the first metal terminal to the common electrode layer when the common electrode layer and the metal terminal are conductively connected. Because common electrode layer is disposed in an entire surface and is conductive with the entire surface, a current would move from the common electrode to the electron injection layer on the second metal terminal, then move from the electron injection layer on the second metal terminal to the electron transport layer and the second metal terminal, and then move from the second metal terminal to the second metal wiring such that a loop from the high-level voltage end to the low-level voltage end is obtained to conductively connect the common electrode layer and the metal terminal.

The above embodiment specifically describes the first metal terminal and the second metal terminal disposed on the two sides of the display region to achieve connection of the common electrode layer and the metal terminal. However, the embodiment of the present application is not limited thereto. For example, to solve a space, the first metal terminal and the second metal terminal can be disposed on one side of the display region. Accordingly, a disposing manner of positive connection terminals and negative connection terminals in the following embodiment can also use a manner of the bridge region on one side of the display region, which is not described repeatedly in the following embodiment.

Figure 3:
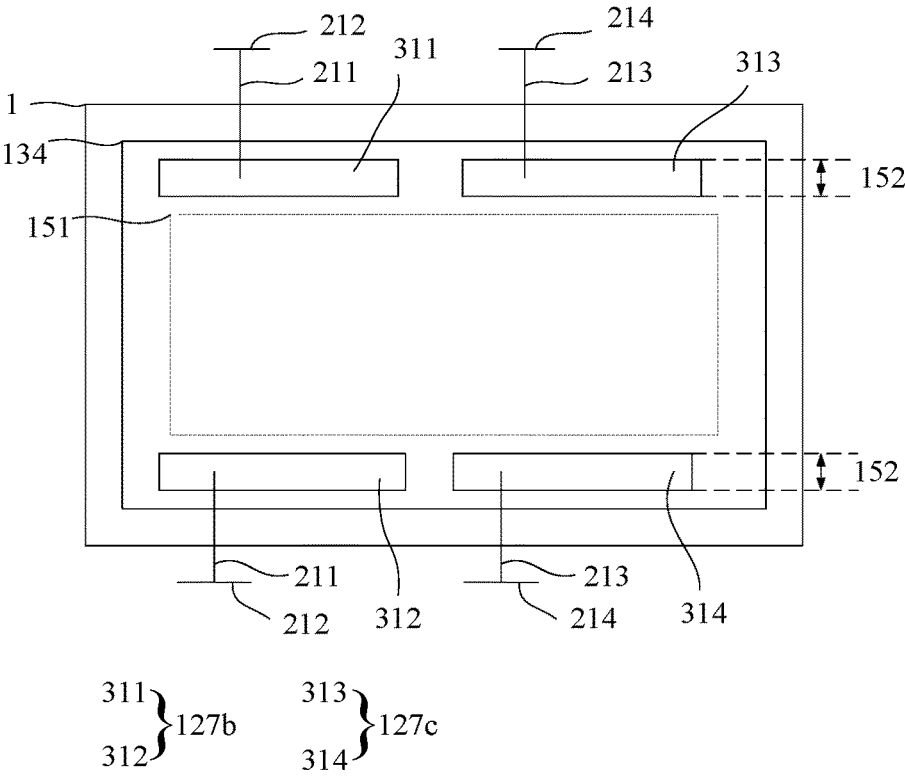
FIG. 3 is a third schematic view of the OLED display panel provided by the embodiment of the present application.

In an embodiment, with reference to FIGS. 3, the first metal terminal 127b includes a plurality of positive connection terminals (for example, a first positive connection terminal 311 and a second positive connection terminal 312), and the second metal terminal 127c includes a plurality of negative connection terminals (for examples, a first negative connection terminal 313 and a second negative connection terminal 314). The positive connection terminals are disposed in the bridge region 152 on the two sides of the display region 151. The negative connection terminals are disposed in the bridge region 152 on the two sides of the display region 151. Furthermore, the positive connection terminals are disposed to correspond to the negative connection terminals. By disposing the positive connection terminals and the negative connection terminals, when the common electrode layer and the metal terminal are conductively connected, transmission of different signals can be achieved by conductive connection of the connection terminals, or by the conductive connection of the connection terminals, when connection of a certain metal terminal is broken, conductive connection of the common electrode layer and the metal terminal can still be achieved by other metal terminal.

In an embodiment, with reference to FIGS. 3, the positive connection terminals include a first positive connection terminal 311, a second positive connection terminal 312, the negative connection terminals include a first negative connection terminal 313, a second negative connection terminal 314, the first positive connection terminal 311 and the first negative connection terminal 313 are disposed in bridge region 152 on one side of the display region 151, and the second positive connection terminal 312 and the second negative connection terminal 314 are disposed in the bridge region 152 on the other side of the display region 151. The first positive connection terminal 311 is electrically connected to the first negative connection terminal 313, and the second positive connection terminal 312 is electrically connected to the second negative connection terminal 314. Electrically connecting the first positive connection terminal to the first negative connection terminal on the same side and electrically connecting the second positive connection terminal to the second negative connection terminal on the same side achieve conductive connection of the common electrode layer and the metal terminal.

It should be explained that electrical connection in the embodiment of the present application means that a current moves from an end to another end. Because the first metal terminal and the second metal terminal in the present application are disposed insulatively, electrical connection in the embodiment of the present application includes no physical connection between two ends. For example, the first positive connection terminal electrically connected to the first negative connection terminal means that a current moves from the first positive connection terminal wiring to the first negative connection terminal, or the current moves from the first negative connection terminal wiring to the first positive connection terminal instead of meaning that physical connection between the first positive connection terminal and the first negative connection terminal. Electrical connection in the following embodiment is based on the above description, which is not repeatedly described in the following embodiment.

In an embodiment, the positive connection terminals include a third positive connection terminal and a fourth positive connection terminal, the negative connection terminals include a third negative connection terminal and a fourth negative connection terminal, the third positive connection terminal and the fourth positive connection terminal are disposed in a terminal region on one of the sides of the display region, the third negative connection terminal and the fourth negative connection terminal are disposed in a terminal region on the other side of the display region, the third positive connection terminal is electrically connected to the third negative connection terminal, and the fourth positive connection terminal is electrically connected to the fourth negative connection terminal. Disposing the positive connection terminals in the terminal region on one side of the display region, disposing the negative connection terminals in the terminal region on the other side of the display region, and then connecting the positive connection terminals and the negative connection terminals on the two sides make conductive connection between the common electrode layer and the metal terminal, and also a plurality of connection terminals are connected correspondingly, which achieves multi-conductive conductive connection between the common electrode layer and the metal terminal.

In an embodiment, the positive connection terminals include a fifth positive connection terminals and a sixth positive connection terminals, the negative connection terminals include a fifth negative connection terminals and a sixth negative connection terminals, the fifth positive connection terminals and fifth negative connection terminals are disposed in a terminal region on one of the sides of the display region, the sixth positive connection terminals and the sixth negative connection terminals are disposed in a terminal region on the other side of the display region, the fifth positive connection terminals is electrically connected to the sixth negative connection terminals, and the sixth positive connection terminals is electrically connected to the fifth negative connection terminals. The positive connection terminals and the negative connection terminals are disposed on two sides of the display region and the positive connection terminals and negative connection terminals are electrically connected to achieve conductive connection between the common electrode layer and the metal terminal. Furthermore, correspondingly connecting the connection terminals achieves multi-conductive connection among the common electrode layer and the metal terminal.

The above embodiment describes connection manners in detail with the first positive connection terminal to the sixth positive connection terminal, the first negative connection terminal to the sixth negative connection terminal. However, it should be explained that in the embodiment of the present application first, second to sixth means no specific connection terminal, and under a prerequisite of a plurality of connection manners, multiple connection manners can be used to achieve conductive connection of the metal terminal and the common electrode layer, which is not repeatedly described here.

For the issue that the organic material of the electron injection layer and the electron transport layer cannot conductively connect the metal terminal and the common electrode layer and requires two different mask plates for respectively forming the common electrode layer and the electron injection layer and the electron transport layer to cause a lower manufacturing efficiency of the display device, in an embodiment, a material of the electron injection layer includes an organic material, a material of the electron transport layer includes an organic material, the voltage difference between the high-level voltage end and the low-level voltage end is greater than the turn-on voltage of the electron injection layer and the electron transport layer. when the material of the electron injection layer and the electron transport layer is an organic material, conductivity of the electron injection layer and the electron transport layer is poor, the first metal terminal and the second metal terminal are connected to the high-level voltage end and the low-level voltage end respectively such that the voltage difference between the high-level voltage end and the low-level voltage end is greater than the turn-on voltage of the electron injection layer and the electron transport layer. At this time, the current can strike through the electron injection layer and the electron transport layer, or temperature increase due to a voltage can burn and connect the electron injection layer and the electron transport layer. The material of the metal terminal and the common electrode layer is a conductive material such that the metal terminal and the common electrode layer can be conductively connected such that the common electrode layer and the metal terminal can also be conductively connected when one mask plate is used to form the common electrode layer, the electron injection layer, and the electron transport layer.

In an embodiment, when a voltage is inputted in the high-level voltage end and the low-level voltage end, a temperature of the bridge region ranges from 50° C. to 120° C. Because the electron injection layer and the electron transport layer are organic materials, the electron injection layer and the electron transport layer would be burned and connected when the inputted voltage increases the temperature of the bridge region such that the common electrode layer and the metal terminal bridge region are welded together to achieve conductive connection of the common electrode layer and the metal terminal. Furthermore, between 50° C. and 120° C., the metal terminal and the common electrode layer has better stability without burning and damaging the common electrode layer and the metal terminal due to increase of the temperature and affecting a display effect.

Particularly, a sum of a thickness of the electron injection layer and a thickness of the electron transport layer is less than 200 nm. The thicknesses of the electron injection layer and the electron transport layer are lowered such that the electron injection layer and the electron transport layer can be burned and connected.

For the issue that the organic material of the electron injection layer and the electron transport layer cannot conductively connect the metal terminal and the common electrode layer and requires two different mask plates for respectively forming the common electrode layer and the electron injection layer and the electron transport layer to cause a lower manufacturing efficiency of the display device, in an embodiment, a material of the common electrode layer includes a metal material, and the voltage difference between the high-level voltage end and the low-level voltage end is greater than a first migration voltage of the metal material. The material of the common electrode layer is disposed as the metal material and the voltage difference between the high-level voltage end and the low-level voltage end is greater than the first migration voltage of the metal material such that when a voltage is inputted, metal particles in the common electrode layer would migrate to the electron injection layer and the electron transport layer to improve conductivity of the electron injection layer and the electron transport layer, which achieves conductive connection of the common electrode layer and the metal terminal and improves the manufacturing efficiency of the display panel.

Particularly, the first migration voltage refers to a voltage able to migrate the metal material and conductively connect the metal terminal and the common electrode layer. For example, a voltage of 2 volts can migrate the metal material and conductively connect the metal terminal and the common electrode layer, and the voltage of 2 volts can be set as a first migration voltage.

Particularly, a material of the common electrode layer includes silver or silver alloy because silver has a higher mobility. Using silver as a material of the common electrode layer can improve a migration effect to further enhance a conductive connection effect of the metal terminal and the common electrode layer.

Particularly, for the OLED display panel including a top emission OLED display panel and a bottom emission OLED display panel, the top emission OLED display panel using silver as a common electrode layer would result in an issue of a lowered transmittance. Therefore, the embodiment of the present application, when using silver or silver alloy as a top emission OLED display panel, can have the common electrode layer with a smaller thickness. For example, the thickness of the common electrode layer ranges from 10 nm to 30 nm to guarantee a transmittance of the top emission OLED display panel. For a bottom emission OLED display device, a thicker common electrode layer can be used to improve reflectivity.

In an embodiment, the common electrode layer is set as a single layer. Disposing a single layer reduces the thickness of the common electrode layer and also improves a migration effect of particles such that the common electrode layer and the metal terminal are conductively connected. However, the embodiment of the present application is not limited thereto and the common electrode layer can be set as a multi-layer including one layer formed by silver or silver alloy.

For the issue that the organic material of the electron injection layer and the electron transport layer cannot conductively connect the metal terminal and the common electrode layer and requires two different mask plates for respectively forming the common electrode layer and the electron injection layer and the electron transport layer to cause a lower manufacturing efficiency of the display device, in an embodiment, the material of the electron injection layer includes first conductive material, the material of the electron transport layer includes an organic material, and the voltage difference between the high-level voltage end and the low-level voltage end is greater than a second migration voltage of the electron injection layer. The conductive material serves as a material of the electron injection layer and the voltage difference between the high-level voltage end and the low-level voltage end is greater than the second migration voltage of the electron injection layer such that, conductive particles in the electron injection layer can migrate to the electron transport layer under an effect of an electrical field when a voltage is inputted. Because the common electrode layer and the metal terminal are a conductive material, and the common electrode layer and the metal terminal can be conductively connected when the common electrode layer, the electron injection layer, and the electron transport layer are formed by the same mask plate.

Particularly, the material of the electron injection layer includes lithium and ytterbium.

Particularly, the second migration voltage refers to a voltage migrating the conductive material of the electron injection layer and conductively connect the metal terminal and the common electrode layer. For example, a voltage of 2 volts can migrate the conductive material and conductively connect the metal terminal and the common electrode layer, and the voltage of 2 volts can be set as a second migration voltage.

In an embodiment, a second conductive material is doped in the electron transport layer, and the voltage difference between the high-level voltage end and the low-level voltage end is greater than a third migration voltage of the second conductive material. Doping the conductive material in the electron transport layer makes the conductive material able to migrate to form a closed circuit between the metal terminal and the common electrode layer to conductive connect the common electrode layer and the metal terminal.

Particularly, the third migration voltage refers to a voltage able to migrate the conductive material in the electron transport layer and conductively connect the metal terminal and the common electrode layer. For example, a voltage of 2 volts can migrate the conductive material and conductively connect the metal terminal and the common electrode layer, and the voltage of 2 volts can be set as a third migration voltage.

For the issue that the organic material of the electron injection layer and the electron transport layer cannot conductively connect the metal terminal and the common electrode layer and requires two different mask plates for respectively forming the common electrode layer and the electron injection layer and the electron transport layer to cause a lower manufacturing efficiency of the display device, in an embodiment, the material of the electron injection layer includes an organic material, the material of the electron transport layer includes an organic material, a third conductive material is doped in at least one of the electron injection layer and the electron transport layer, and the voltage difference between the high-level voltage end and the low-level voltage end is greater than a fourth migration voltage of the third conductive material. The electron injection layer and the electron transport layer are doped with the conductive material, and the voltage difference between the high-level voltage end and the low-level voltage end is greater than the migration voltage of the conductive material such that the doped metal forms a similar microscopic metal thin thread when a voltage is inputted to make the electron injection layer and the electron transport layer form a closed circuit to conductively connect the metal terminal and the common electrode layer, and the common electrode layer and the metal terminal can be conductively connected when the common electrode layer, the electron injection layer, and the electron transport layer are formed by the same mask plate to improve a manufacturing efficiency of the OLED display panel.

Particularly, the fourth migration voltage refers to a voltage able to migrate the conductive material in the electron transport layer and conductively connect the metal terminal and the common electrode layer. For example, a voltage of 2 volts can migrate the conductive material and conductively connect the metal terminal and the common
electrode layer, and the voltage of 2 volts can be set as a
fourth migration voltage.

It should be explained that first conductive material,
second conductive material, and third conductive material
can be the same material or can be different materials.

It should be explained that the above embodiment speci-
fies the first migration voltage to the fourth migration
voltage, and the turn-on voltage explains a voltage under
different setting. However, names of the first to fourth and
each voltage not only have no limit to a specific value of a
certain voltage but also no limit to a certain voltage greater
than another voltage. For example, the first migration volt-
age is not necessarily greater than second migration voltage,
the first migration voltage can be the same as the second
migration voltage according to a demand, the first migration
voltage can also be greater than second migration voltage,
and the first migration voltage can also be less than second
migration voltage.

It should be explained that the above embodiment uses the
electron injection layer of an organic material, the electron
transport layer of an organic material, the common electrode
layer of a metal material, the electron injection layer of a
conductive material, the electron transport layer of an
organic material, the electron injection layer and the electron
transport layer of an organic material doped with a conduc-
tive material as an example for detailed explanation. How-
ever, because no conflict exists in some features of the above
embodiment, the embodiment of the present application can
serve a plurality of features as an embodiment. The embodi-
ment of the present application is not limited by the above
embodiment and can combine plurality of features as an
embodiment when the features have no conflict to further
improve an effect of conductive connection of the common
electrode layer and the metal terminal.

Particularly, to explain that a plurality of features can be
combined as an embodiment, the embodiment of the present
application includes a plurality of combined embodiments
but does not enumerate all embodiments. Two embodiments
are described in the following embodiment.

In an embodiment, the material of the electron transport
layer includes an organic material, the material of the
electron injection layer includes an organic material, at least
one layer of the electron transport layer and the electron
injection layer is doped with a conductive material, and the
material of the common electrode layer includes a metal
material. The voltage difference between the high-level
voltage end and the low-level voltage end is greater than the
turn-on voltage of the electron injection layer and the
electron transport layer. The electron transport layer and
electron injection layer are doped with a conductive mate-
rial, the material of the common electrode layer includes a
metal material, and the voltage difference between the
high-level voltage end and the low-level voltage end is
greater than the turn-on voltage of the electron injection
layer and the electron transport layer such that under an
effect of an electrical field, the electron injection layer and
the electron transport layer would be burned and connected.
Also, metal particles of the common electrode layer and
conductive particles in the electron injection layer and/or the
electron transport layer would migrate to make the metal
terminal and the common electrode layer conductively con-
nected through a plurality of manners such that the common
electrode layer and the metal terminal can be conductively
connected when the common electrode layer, the electron
injection layer and the electron transport layer are formed by the same mask plate, which improves a manufacturing
efficiency of the OLED display panel.

Particularly, also, a material of the electron transport layer
can include an organic material, a material of the electron
injection layer includes conductive material, a conductive
material is doped in the electron transport layer, a material
of the common electrode layer includes a metal material, the
voltage difference between the high-level voltage end and
the low-level voltage end is greater than the turn-on voltage
of the electron injection layer and the electron transport
layer. The embodiment of the present application uses it as
an example and would not have a repeated description.

The above embodiment uses a voltage controlling con-
ductive connection of the common electrode layer and the
metal terminal as an example for explanation. For specific
control of the voltage, it is required to determine the voltage
according to a bridge area between the common electrode
layer and the metal terminal, the material of the electron
injection layer and the electron transport layer, the thickness
of the electron injection layer and thickness electron trans-
port layer, the material of the common electrode layer, and
the circuit design, to determine the current to prevent from
damaging the common electrode layer while conductively
connecting the common electrode layer and the metal ter-
minal.

Particularly, a current and a time can be used to control
conductive connection of the common electrode layer and
the metal terminal. The specific current and time are deter-
mined according to the above factors and are not repeatedly
described here.

Figure 4:
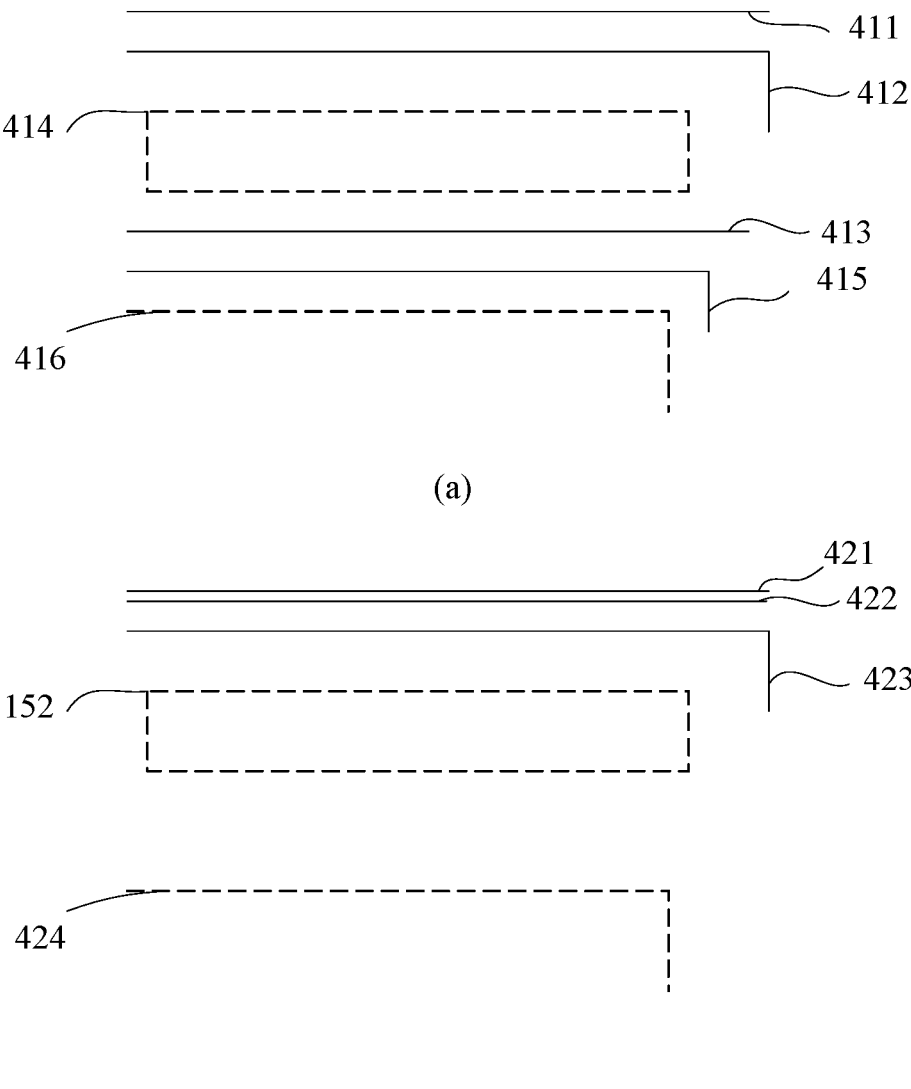
FIG. 4 is a schematic comparison view of a design of a mask plate of the OLED display panel provided by the embodiment of the present application and a design of mask plate a of a conventional OLED display panel.

With reference to FIG. 4, a part (a) of FIG. 4 is a design
solution of a mask plate of the conventional OLED display
panel. It can be seen from the part (a) of FIG. 4(a) that
because the electron injection layer and the electron trans-
port layer cannot be conductively connected to the common
electrode layer and the metal terminal, the film forming
areas of the electron injection layer and the electron trans-
port layer are necessarily less than the film forming area of
the common electrode layer, a boundary 413 of the electron
injection layer and/or the electron transport layer is located
under a boundary 411 of the common electrode layer, and a
boundary 415 of the first mask plate is different from a
boundary 412 of the second mask plate such that the electron
injection layer and the electron transport layer are close to a
boundary 416 of the display region without covering the
bridge region 414. Therefore, the conventional OLED dis-
play device needs to use different mask plates to form the
common electrode layer, the electron injection layer, and the
electron transport layer.

With reference to a part (b) of FIGS. 4, the present
application uses one mask plate to form the electron injec-
tion layer, the electron transport layer, and the common
electrode layer. When none of the boundary 424 and the
bridge region 152 of the display region is changed, the
boundary 423 of the mask plate is one, the boundary 422 of
the electron injection layer and/or the electron transport
layer substantially or completely coincides with the bound-
ary 421 of the common electrode layer, and with the
conductive connection of the common electrode layer and
the metal terminal of the above embodiment, the same mask
plate is used to form the electron injection layer, the electron
transport layer, and the common electrode layer, which
improves a manufacturing efficiency of the OLED display
panel and lowers the cost.

In an embodiment, with reference to FIGS. 1, the driver
circuit layer 12 includes an active layer 121, a first gate
electrode insulation layer 122, a first metal layer 123, a second gate electrode insulation layer 124, a second metal layer 125, an interlayer insulation layer 126, a source and drain electrode layer 127, and a planarization layer 128.

In an embodiment, with reference to FIGS. 1, the sourced and drain electrode layer 127 includes a source electrode 127a and a drain electrode.

In an embodiment, with reference to FIGS. 1, light emitting function layer 13 includes a pixel electrode layer 131, a light emitting material layer 132, and a pixel definition layer 133.

In an embodiment, with reference to FIGS. 1, the light emitting material layer 132 includes a hole injection layer 132a, a hole transport layer 132b, and a light emitting layer 132c.

Figure 5:
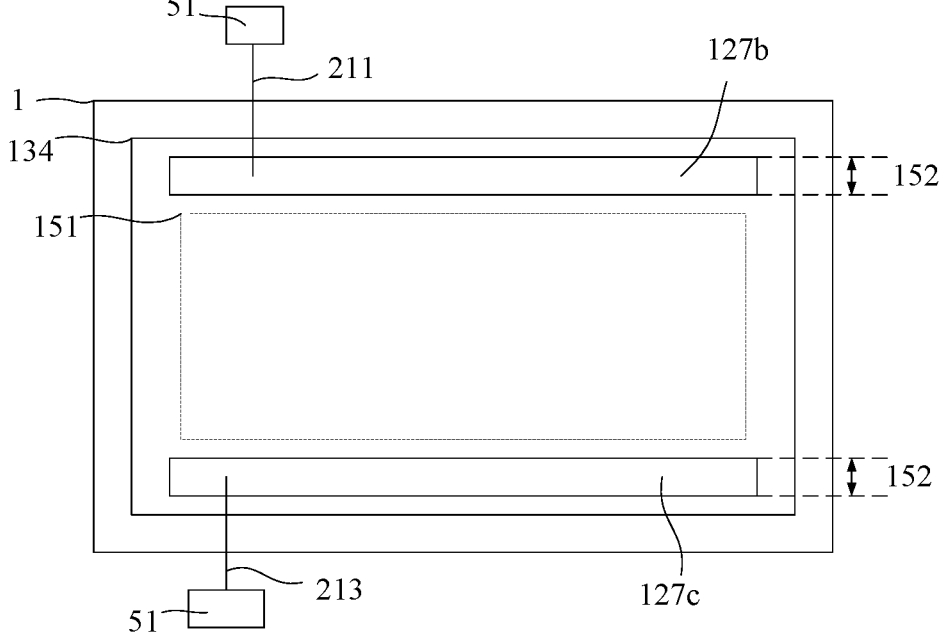
FIG. 5 is a schematic view of an OLED display device provided by the embodiment of the present application.

Also, with reference to FIGS. 1, 2, and 5, the embodiment of the present application provides an OLED display device, the OLED display device includes an OLED display panel 1 and a power source 51, and the OLED display panel 1 includes:

an underlay 11;

a driver circuit layer 12 disposed on a side of the underlay 11, the driver circuit layer 12 includes metal terminal 127d, the metal terminal 127d includes a first metal terminal 127b and a second metal terminal 127c, the first metal terminal 127b and the second metal terminal 127c are disposed insulatively;

a light emitting function layer 13 disposed on a side of the driver circuit layer 12 away from the underlay 11, wherein the light emitting function layer 13 includes an electron injection layer 132e, an electron transport layer 132d, and a common electrode; and an encapsulation layer 14 disposed on a side of the light emitting function layer 13 away from the driver circuit layer 12;

wherein the OLED display panel 1 includes a display region 151 and a bridge region 152, in the bridge region 152, an electron injection layer 132e and an electron transport layer 132d are disposed between the common electrode layer 134 and the metal terminal 127d, a side of the first metal terminal 127b is connected to the high-level voltage end 212, another side of the first metal terminal 127b is connected to the electron transport layer 132d, a side of the second metal terminal 127c is connected to the electron transport layer 132d, another side of the second metal terminal 127c is connected to the low-level voltage end 214, and a voltage difference between the high-level voltage end 212 and the low-level voltage end 214 is greater than a turn-on voltage of the metal terminal 127d and the common electrode layer 134.

The embodiment of the present application provides an OLED display device, and the OLED display device includes an OLED display panel and a power source. The OLED display panel disposes the electron injection layer and the electron transport layer in the bridge region such that one metal mask plate can be used to form the electron injection layer, the electron transport layer, and the common electrode layer, which improves a manufacturing efficiency of the OLED display panel. Also, the high-level voltage end and the low-level voltage end are connected to the first metal terminal and the second metal terminal respectively, and the voltage difference between the high-level voltage end and the low-level voltage end is greater than the turn-on voltage of the metal terminal and the common electrode layer such that a conductivity of the electron injection layer and the electron transport layer is poor, and under an effect of the voltage, by burning and connecting the electron injection layer and the electron transport layer or electron migration, conductive connection of the common electrode layer and the metal terminal can be achieved to make the OLED display panel work normally.

In an embodiment, the high-level voltage end is connected to a positive electrode of the power source, and the low-level voltage end is connected to a negative electrode of the power source.

In an embodiment, in the OLED display device, the first metal terminal and the second metal terminal are disposed in the bridge region on the two sides of the display region respectively.

In an embodiment, in the OLED display device, the first metal terminal includes a plurality of positive connection terminals, the second metal terminal includes a plurality of negative connection terminals, the positive connection terminals are disposed in the bridge region on the two sides of the display region, the negative connection terminals are disposed in the bridge region on the two sides of the display region, and the positive connection terminals are disposed to correspond to the negative connection terminals.

In an embodiment, in the OLED display device, the positive connection terminals include a first positive connection terminal and a second positive connection terminal, the negative connection terminals include a first negative connection terminal and a second negative connection terminal, the first positive connection terminal and the first negative connection terminal are disposed in the bridge region on one of the sides of the display region, the second positive connection terminal and the second negative connection terminal are disposed in the bridge region on the other side of the display region, the first positive connection terminal is electrically connected to the first negative connection terminal, and the second positive connection terminal is electrically connected to the second negative connection terminal.

In an embodiment, in the OLED display device, the positive connection terminals include a third positive connection terminal and a fourth positive connection terminal, the negative connection terminals include a third negative connection terminal and a fourth negative connection terminal, the third positive connection terminal and the fourth positive connection terminal are disposed in a terminal region on one of the sides of the display region, the third negative connection terminal and the fourth negative connection terminal are disposed in a terminal region on the other side of the display region, the third positive connection terminal is electrically connected to the third negative connection terminal, and the fourth positive connection terminal is electrically connected to the fourth negative connection terminal.

In an embodiment, in the OLED display device, a material of the electron injection layer includes an organic material, a material of the electron transport layer includes an organic material, and the voltage difference between the high-level voltage end and the low-level voltage end is greater than a turn-on voltage of the electron injection layer and the electron transport layer.

In an embodiment, in the OLED display device, a temperature of the bridge region ranges from 50° C. to 120° C. when a voltage is inputted in the high-level voltage end and the low-level voltage end.

In an embodiment, in the OLED display device, a material of the common electrode layer includes a metal material, and the voltage difference between the high-level voltage end and the low-level voltage end is greater than a first migration voltage of the metal material.

In an embodiment, in the OLED display device, a material of the electron injection layer includes a conductive material, a material of the electron transport layer includes an organic material, and the voltage difference between the high-level voltage end and the low-level voltage end is greater than a second migration voltage of the electron injection layer.

It is known according to the above embodiment that:

The embodiment of the present application provides an OLED display panel and an OLED display device. The OLED display panel includes an underlay, a driver circuit layer, a light emitting function layer, and an encapsulation layer. The driver circuit layer is disposed on a side of the underlay. The driver circuit layer includes a metal terminal, and the metal terminal includes a first metal terminal and a second metal terminal. The first metal terminal and the second metal terminal are disposed insulatively. The light emitting function layer is disposed on a side of the driver circuit layer away from underlay. The light emitting function layer includes an electron injection layer. The electron transport layer, the common electrode layer, and the encapsulation layer are disposed on a side of the light emitting function layer away from driver circuit layer. The OLED display panel includes a display region and a bridge region. In bridge region, an electron injection layer and an electron transport layer are disposed between the common electrode layer and the metal terminal. A side of the first metal terminal is connected to a high-level voltage end, and another side of the first metal terminal is connected to the electron transport layer. A side of the second metal terminal is connected to the electron transport layer, and another side of the second metal terminal is connected to a low-level voltage end. A voltage difference between the high-level voltage end and the low-level voltage end is greater than a turn-on voltage of the metal terminal and the common electrode layer. The present application disposes the electron injection layer and the electron transport layer in the bridge region such that one metal mask plate can be used to form the electron injection layer, the electron transport layer, and the common electrode layer, which improves a manufacturing efficiency of the OLED display panel and lowers a cost. Also, the high-level voltage end and the low-level voltage end are connected to the first metal terminal and the second metal terminal respectively, and the voltage difference between the high-level voltage end and the low-level voltage end is greater than the turn-on voltage of the metal terminal and the common electrode layer such that a conductivity of the electron injection layer and the electron transport layer is poor, and under an effect of the voltage, by burning and connecting the electron injection layer and the electron transport layer or electron migration, conductive connection of the common electrode layer and the metal terminal can be achieved to make the OLED display panel work normally.

In the above-mentioned embodiments, the descriptions of the various embodiments are focused. For the details of the embodiments not described, reference may be made to the related descriptions of the other embodiments.

The OLED display panel and the OLED display device provided by the embodiment of the present application are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. An organic light emitting diode (OLED) display panel, comprising:

an underlay;

a driver circuit layer disposed on a side of the underlay, wherein the driver circuit layer comprises a metal terminal, the metal terminal comprises a first metal terminal and a second metal terminal, and the first metal terminal and the second metal terminal are disposed insulatively;

a light emitting function layer disposed on a side of the driver circuit layer away from the underlay, wherein the light emitting function layer comprises an electron injection layer, an electron transport layer, and a common electrode layer; and an encapsulation layer disposed on a side of the light emitting function layer away from the driver circuit layer;

wherein the OLED display panel comprises a display region and a bridge region, in the bridge region, an electron injection layer and an electron transport layer are disposed between the common electrode layer and the metal terminal comprising the first metal terminal and the second metal terminal, a side of the first metal terminal is connected to a high-level voltage end, another side of the first metal terminal is connected to the electron transport layer, a side of the second metal terminal is connected to the electron transport layer, another side of the second metal terminal is connected to a low-level voltage end, and a voltage difference between the high-level voltage end and the low-level voltage end is greater than a turn-on voltage of the metal terminal comprising the first metal terminal and the second metal terminal and the common electrode layer;

wherein the first metal terminal comprises a plurality of positive connection terminals, the second metal terminal comprises a plurality of negative connection terminals, the plurality of the positive connection terminals are disposed in the bridge region on two opposite sides of the display region that are parallel to each other, the plurality of the negative connection terminals are disposed in the bridge region on the two opposite sides of the display region, and the plurality of the positive connection terminals are disposed to correspond to the plurality of the negative connection terminals;

wherein the plurality of the positive connection terminals and the plurality of the negative connection terminals on the opposite sides are individually spaced from each other;

wherein a material of the electron injection layer comprises an organic material, a material of the electron transport layer comprises an organic material, and the voltage difference between the high-level voltage end and the low-level voltage end is greater than a turn-on voltage of the electron injection layer and the electron transport layer;

wherein the plurality of the positive connection terminals comprise a first positive connection terminal and a second positive connection terminal that are right opposite to each other, the plurality of the negative connection terminals comprise a first negative connection terminal and a second negative connection terminal that are right opposite to each other, the first positive connection terminal and the first negative connection terminal are disposed in the bridge region on one of the opposite sides of the display region, the second positive connection terminal and the second negative connection terminal are disposed in the bridge region on the other side of the display region, the first positive connection terminal is electrically connected to the first negative connection terminal, and the second positive connection terminal is electrically connected to the second negative connection terminal.

2. The OLED display panel according to claim 1, wherein the plurality of the positive connection terminals comprise a third positive connection terminal and a fourth positive connection terminal, the plurality of the negative connection terminals comprise a third negative connection terminal and a fourth negative connection terminal, the third positive connection terminal and the fourth positive connection terminal are disposed in a terminal region on one of the sides of the display region, the third negative connection terminal and the fourth negative connection terminal are disposed in a terminal region on the other side of the display region, the third positive connection terminal is electrically connected to the third negative connection terminal, and the fourth positive connection terminal is electrically connected to the fourth negative connection terminal.

3. The OLED display panel according to claim 1, wherein a temperature of the bridge region ranges from 50° C. to 120° C. when a voltage is inputted in the high-level voltage end and the low-level voltage end.

4. The OLED display panel according to claim 1, wherein a material of the common electrode layer comprises a metal material, the voltage difference between the high-level voltage end and the low-level voltage end is greater than a first migration voltage of the metal material.

5. The OLED display panel according to claim 1, wherein a material of the electron injection layer comprises a first conductive material, a material of the electron transport layer comprises an organic material, the voltage difference between the high-level voltage end and the low-level voltage end is greater than a second migration voltage of the electron injection layer.

6. The OLED display panel according to claim 5, wherein a second conductive material is doped in the electron transport layer, and the voltage difference between the high-level voltage end and the low-level voltage end is greater than a third migration voltage of the second conductive material.

7. The OLED display panel according to claim 1, wherein a material of the electron injection layer comprises an organic material, a material of the electron transport layer comprises an organic material, a third conductive material is doped in at least one of the electron injection layer and the electron transport layer, and the voltage difference between the high-level voltage end and the low-level voltage end is greater than a fourth migration voltage of the third conductive material.

8. An OLED display device, comprising an OLED display panel and a power source, wherein the OLED display panel comprises:

an underlay;

a driver circuit layer disposed on a side of the underlay, wherein the driver circuit layer comprises a metal terminal, the metal terminal comprises a first metal terminal and a second metal terminal, and the first metal terminal and the second metal terminal are disposed insulatively;

a light emitting function layer disposed on a side of the driver circuit layer away from the underlay, wherein the light emitting function layer comprises an electron injection layer, an electron transport layer, and a common electrode layer; and an encapsulation layer disposed on a side of the light emitting function layer away from the driver circuit layer;

wherein the OLED display panel comprises a display region and a bridge region, in the bridge region, an electron injection layer and an electron transport layer are disposed between the common electrode layer and the metal terminal comprising the first metal terminal and the second metal terminal, a side of the first metal terminal is connected to a high-level voltage end, another side of the first metal terminal is connected to the electron transport layer, a side of the second metal terminal is connected to the electron transport layer, another side of the second metal terminal is connected to a low-level voltage end, and a voltage difference between the high-level voltage end and the low-level voltage end is greater than a turn-on voltage of the metal terminal comprising the first metal terminal and the second metal terminal and the common electrode layer;

wherein the first metal terminal comprises a plurality of positive connection terminals, the second metal terminal comprises a plurality of negative connection terminals, the plurality of the positive connection terminals are disposed in the bridge region on two opposite sides of the display region that are parallel to each other, the plurality of the negative connection terminals are disposed in the bridge region on the two opposite sides of the display region, and the plurality of the positive connection terminals are disposed to correspond to the plurality of the negative connection terminals;

wherein the plurality of the positive connection terminals and the plurality of the negative connection terminals on the opposite sides are individually spaced from each other;

wherein a material of the electron injection layer comprises an organic material, a material of the electron transport layer comprises an organic material, and the voltage difference between the high-level voltage end and the low-level voltage end is greater than a turn-on voltage of the electron injection layer and the electron transport layer;

wherein the plurality of the positive connection terminals comprise a first positive connection terminal and a second positive connection terminal that are right opposite to each other, the plurality of the negative connection terminals comprise a first negative connection terminal and a second negative connection terminal that are right opposite to each other, the first positive connection terminal and the first negative connection terminal are disposed in the bridge region on one of the opposite sides of the display region, the second positive connection terminal and the second negative connection terminal are disposed in the bridge region on the other side of the display region, the first positive connection terminal is electrically connected to the first negative connection terminal, and the second positive connection terminal is electrically connected to the second negative connection terminal.

9. The OLED display device according to claim 8, wherein the high-level voltage end is connected to a positive electrode of the power source, and the low-level voltage end is connected to a negative electrode of the power source.

10. The OLED display device according to claim 8, wherein the plurality of the positive connection terminals comprise a third positive connection terminal and a fourth positive connection terminal, the plurality of the negative connection terminals comprise a third negative connection terminal and a fourth negative connection terminal, the third positive connection terminal and the fourth positive connection terminal are disposed in a terminal region on one of the sides of the display region, the third negative connection terminal and the fourth negative connection terminal are disposed in a terminal region on the other side of the display region, the third positive connection terminal is electrically connected to the third negative connection terminal, and the fourth positive connection terminal is electrically connected to the fourth negative connection terminal.

11. The OLED display device according to claim 8, wherein a temperature of the bridge region ranges from 50° C. to 120° C. when a voltage is inputted in the high-level voltage end and the low-level voltage end.

12. The OLED display device according to claim 8, wherein a material of the common electrode layer comprises a metal material, the voltage difference between the high-level voltage end and the low-level voltage end is greater than a first migration voltage of the metal material.

\* \* \* \* \*